United States Patent [19]
Harris et al.

[11] Patent Number: 5,338,705
[45] Date of Patent: Aug. 16, 1994

[54] PRESSURE DIFFERENTIAL DOWNSET

[75] Inventors: Guy Harris, Carrollton; Duane Callaway, Grand Prairie; Rajesh Shah, Lewisville, all of Tex.

[73] Assignee: Texas Instruments Incorporated, Dallas, Tex.

[21] Appl. No.: 943,278

[22] Filed: Sep. 10, 1992

[51] Int. Cl.⁵ .................................. H01L 21/60
[52] U.S. Cl. ........................ 437/217; 437/209; 437/214; 437/220; 437/211
[58] Field of Search ............ 437/217, 209, 211, 214, 437/220; 269/21; 257/674, 676

[56] References Cited

U.S. PATENT DOCUMENTS

| | | | |
|---|---|---|---|
| 4,100,675 | 7/1978 | Landsittel | 437/217 |
| 4,355,463 | 10/1982 | Burns | 437/217 |
| 5,057,461 | 10/1991 | Fritz | 437/217 |
| 5,064,706 | 12/1991 | Ueda et al. | 437/217 |
| 5,166,099 | 11/1992 | Ueda et al. | 437/217 |
| 5,214,307 | 5/1993 | Davis | 257/676 |

*Primary Examiner*—Tom Thomas
*Assistant Examiner*—Kevin M. Picardat
*Attorney, Agent, or Firm*—Robby T. Holland; Richard Donaldson; Jay Cantor

[57] ABSTRACT

The edges of a semiconductor die are moved away from the lead frame leads attached to the die by using a pressure differential across the semiconductor die.

5 Claims, 2 Drawing Sheets

PRESSURE DIFFERENTIAL DOWNSET

FIELD OF THE INVENTION

This invention relates to semiconductor devices, and more particularly to a method of pressure differential to force a semiconductor device into a nest.

BACKGROUND OF THE INVENTION

TAB semiconductor devices are usually downset using a mechanical pushing action. This is either performed on a gang Inner Lead Bond (ILB) machine, immediately after bond, or as a secondary operation on a special purpose tool.

The object of the downset operation is to lift the TAB leads away from the edge of the semiconductor die. If downset is not performed, the leads may tough the die edge, causing short circuits or leakage. Precise control over the downset operation is critical, as too little downset may not lift all leads sufficiently. Too much downset may induce stresses, causing weakness in the leads, and potential lead failure.

Prior art methods for downset on an Inner Lead Bonder has used a thermode to push down the die. This method lowers and bonds the tape to the die. The bond stage then lowers a controlled distance, and the thermode follows down to downset the tape while the tape remains clamped in place. In this method, the thermode and stage must be designed to allow downset, and must be capable of accurately controlled movement. Sizing of the thermode is critical. To get ideal downset, the thermode must be sized equal to bump dimensions. This makes alignment of the thermode to tape and die very difficult.

Another method is to push the die down after bonding, using a precisely sized plunger to prevent uneven downset. In this method the tip of the plunger presses the delicate surface of the die, and any imperfections in the face of the plunger, or trapped particles may cause damage to the die. Keeping the die level during downset is difficult, as the two have to be exactly centered on the die.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT OF THE INVENTION

Figure 1A:
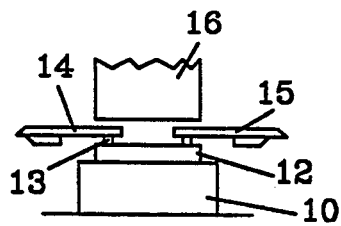
FIGS. 1a, 1b and 1c illustrate the prior art method of downset with the bonder.
Figure 1B:
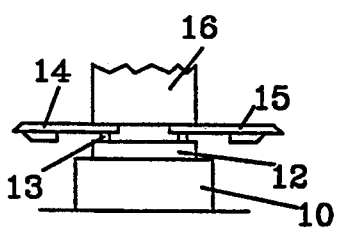
Figure 1C:
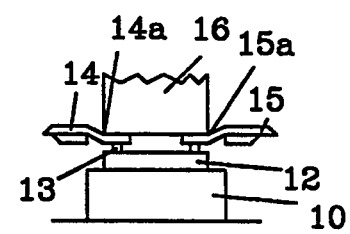

FIGS. 1a, 1b and 1c illustrate a prior art device for lead downsetting on an Inner Lead Bonder using a thermode to push down the semiconductor die to move the leads away from the edge of the die. The semiconductor die is placed on stage 10, and aligned under the tape which includes leads 14 and 15 are placed over bump contacts 13 and 12, respectively. Thermode 16 is lowered to and bonds tape leads 14 and 15 to the contact bumps 13 and 12. After bonding, thermode 16 and stage 10 are lowered simultaneously to downset leads 14 and 15 cause them to bend at 14a and 15a. This process is continued for each successive device.

Figure 2A:
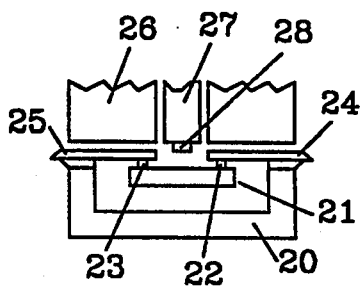
FIGS. 2a, 2b and 2c illustrated the prior at method of downset using a plunger.
Figure 2B:
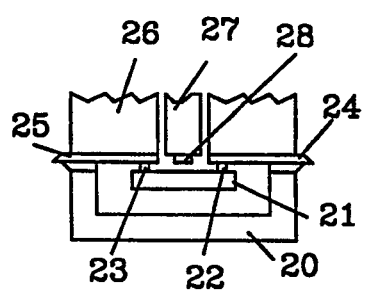
Figure 2C:
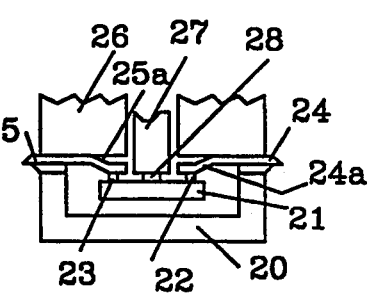

A second prior art method of downset is illustrated in FIGS. 2a, 2b and 2c. In this method, the semiconductor die is already mounted on the leads. The mounted die 21 is placed in a base 20 with the leads 24 and 25 resting on the base 20. A clamp 26 is lowered to clamp leads 24 and 25 against base 20. A plunger 27 having a tip 28 is then lowered and presses against die 21. The downward pressure of plunger 27 bends leads 24 and 25 at 24a and 25a, respectively, moving the die edge away from the leads. This process allows the possibility of die damage when the plunger tip 28 presses against the die.

Figure 3A:
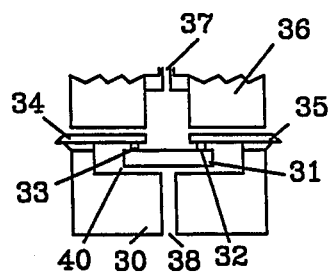
FIGS. 3a, 3b and 3c illustrated the method of the present invention using pressure differential downset.
Figure 3B:
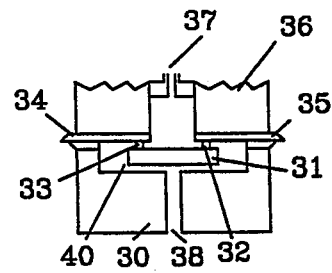
Figure 3C:
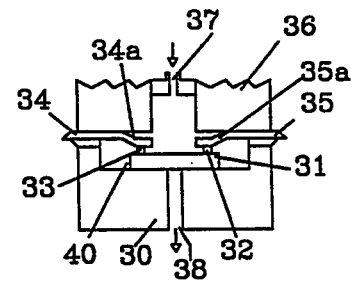

FIGS. 3a, 3b and 3c illustrate the device and method of the present invention. A downset tool is described that is useful for Tape automated bonding (TAB) assembly techniques.

A mounted device 31 is placed in a locating plate or base 30. A precisely sized cavity 40 is located under the die. The depth of cavity 40 is sized to match the downset requirements of the die. While the cavity illustrated is fixed, the bottom plate of the cavity 40 may be adjustable to vary the amount of downset.

After The mounted die 31 is placed in the cavity, leads 34 and 35 rest on the base and holds the bottom of die 31 spaced above the bottom of cavity 40. Clamp 36 is then lowered to clamp the die/lead assembly firmly in position (FIG. 3b). A gas, such as nitrogen, is introduced into inlet 37, and a vacuum is drawn from outlet 38. This causes a pressure differential across die 31. The pressure difference is increased until die 31 seats against the bottom of cavity 40 (FIG. 3c). Leads 34 and 35 bend downward at 34a and 35a, respectively, causing the downset, and moving the edge of die 31 away from the leads 34 and 35.

In practice, there would be more than the two leads illustrated in the figures, there may be leads on two sides or on four sides. The base is configured to accept the number of leads and the number of sides from which leads extend.

What is claimed:

1. A method for downsetting a semiconductor die to move the die edge away from the lead frame leads attached to the die, comprising the steps of:
    suspending a mounted semiconductor die over a cavity in a base by the lead frame leads;
    rigidly clamping the lead frame leads against the base; and
    providing a nonmechanical pressure deferential across the semiconductor die to downset the die in the base cavity, moving the semiconductor die away from the lead frame leads attached thereto.

2. The method according to claim 1, including the step of:
    applying a pressure to the top side of the semiconductor die by introducing a gas, under pressure, through an inlet in the clamp.

3. The method according to claim 1, including the step of:
    drawing a vacuum under the semiconductor die to provide a downward pressure to cause the downset of the die edges from the leads.

4. The method according to claim 1, wherein the pressure differential is provide by introducing a gas on one side of the semiconductor die and drawing a vacuum on another side of the semiconductor die to provide a pressure differential across the semiconductor die.

5. A method for downsetting a semiconductor die to move the die edge away from the lead frame leads attached to the die, comprising the steps of:
suspending a mounted semiconductor die over a cavity in a base by the lead frame leads;
rigidly clamping the lead frame leads against the base; and
providing a pressure deferential across the semiconductor die by introducing a gas on one side of the die and drawing a vacuum on another side of the die to downset the die in the base cavity, moving the semiconductor die away from the lead frame leads attached thereto.

* * * * *